(12) United States Patent
Yamauchi et al.

(10) Patent No.: US 7,304,304 B2
(45) Date of Patent: Dec. 4, 2007

(54) INFRARED SENSOR HAVING NO PACKAGE CAN

(75) Inventors: Shigenori Yamauchi, Nisshin (JP); Tiaki Mizuno, Toyota (JP)

(73) Assignee: DENSO CORPORATION, Kariya (JP)

( * ) Notice: Subject to any disclaimer, the term of this patent is extended or adjusted under 35 U.S.C. 154(b) by 57 days.

(21) Appl. No.: 11/299,726

(22) Filed: Dec. 13, 2005

(65) Prior Publication Data
US 2006/0157651 A1 Jul. 20, 2006

(30) Foreign Application Priority Data
Jan. 14, 2005 (JP) ............................. 2005-008171

(51) Int. Cl.
*G01J 5/00* (2006.01)
(52) U.S. Cl. .................................... 250/338.1
(58) Field of Classification Search .............. 250/338.1
See application file for complete search history.

(56) References Cited

U.S. PATENT DOCUMENTS 5,646,729 A    7/1997   Koskinen et al.
6,621,616 B1 *  9/2003   Bauer et al. ................. 359/273

FOREIGN PATENT DOCUMENTS

| JP | A-4-158583 | 6/1992 |
| JP | 05157625 A * | 6/1993 |
| JP | 06249708 A * | 9/1994 |
| JP | A-2001-351997 | 12/2001 |
| JP | A-2003-270047 | 9/2003 |

* cited by examiner

Primary Examiner—Constantine Hannaher
(74) Attorney, Agent, or Firm—Posz Law Group, PLC

(57) ABSTRACT

An infrared sensor is composed of an optical filter plate, an infrared-detecting plate and a supporting member positioned between both plates. A detecting element for detecting infrared rays passing through the optical filter plate is formed on a front surface of the infrared-detecting plate facing the optical filter plate. The supporting member is positioned to surround the detector element on the infrared-detecting plate to firmly connect both plates and to form a predetermined gap between both plates. The supporting member may be composed of a number of discrete dots positioned to surround the detector element or of a continuous ring surrounding the detector element.

10 Claims, 2 Drawing Sheets

INFRARED SENSOR HAVING NO PACKAGE CAN

CROSS-REFERENCE TO RELATED APPLICATION

This application is based upon and claims benefit of priority of Japanese Patent Application No. 2005-8171 filed on Jan. 14, 2005, the content of which is incorporated herein by reference.

BACKGROUND OF THE INVENTION

1. Field of the Invention

The present invention relates to a sensor for detecting infrared rays.

2. Description of Related Art

An infrared sensor for detecting infrared rays contained in a package can is shown in JP-A-2003-270047. In this infrared sensor, an optical filter through which infrared rays pass is disposed at an opening of a package can, and a detector element that detects the infrared rays passing though the filter is contained in the package can. The infrared sensor of this type is large in size and heavy in weight because it is contained in the package can. A cap and a stem of the package can have to be connected to each other after the filter and the detector element are contained in the package can. This makes a manufacturing cost of the infrared sensor high. In addition, it has been strongly required to make the infrared sensor small in size, light in weight and inexpensive.

SUMMARY OF THE INVENTION

The present invention has been made in view of the above-mentioned problem, and an object of the present invention is to provide an inexpensive and simplified infrared sensor.

The infrared sensor detects gas concentration or kinds of gases by detecting infrared rays passing through the gas. The infrared sensor is composed of an optical filter plate, an infrared-detecting plate on which a detector element is formed, and a supporting member disposed between the optical filter plate and the infrared-detecting plate. Infrared rays enter from a front surface of the optical filter plate into the detector element formed on the front surface of the infrared-detecting plate. The supporting member disposed between both plates connects both plates to each other and forms a predetermined gap therebetween. The supporting member may be made of a solder having a low melting point. An electrical voltage is generated in the detector element from heat absorbed from the infrared rays incident upon the detector element. The electrical voltage is converted into electrical signals in a circuit formed around the detector element on the infrared-detecting plate.

The infrared-detecting plate connected to the optical filter plate may be mounted on a substrate, and the electrical signals may be led out from the converting circuit to the substrate through bonding wires. A depressed portion may be made on the rear surface of the infrared-detecting plate, so that a thin membrane is formed on the front surface of the infrared-detecting plate. The detector element is formed on the thin membrane so that a heat capacity of the detector element is reduced and the detector element quickly responds to the infrared rays. The side of the infrared sensor may be covered with insulating resin, leaving the front surface of the optical filter plate and the substrate exposed to outside. By covering the side with the insulating resin, a mechanical strength of the infrared sensor is enhanced, and the infrared rays entering from the side of the sensor are completely cut. The supporting member may be composed of a number of discrete dots placed to surround the detector element, or a continuous ring surrounding the detector element.

According to the present invention, the infrared sensor can be formed without using a package can. The supporting member positioned between the optical filter plate and the infrared-detecting plate firmly connects the optical filter plate to the infrared-detecting plate and secures a predetermined gap between both plates to avoid any damages that may be caused in both plates during their assembling process. Other objects and features of the present invention will become more readily apparent from a better understanding of the preferred embodiments described below with reference to the following drawings.

DETAILED DESCRIPTION OF THE PREFERRED EMBODIMENTS

Figure 1:
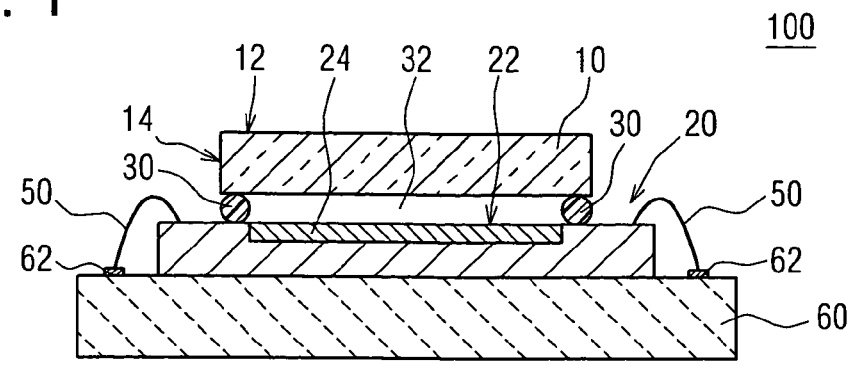
FIG. 1 is a cross-sectional view showing an infrared sensor as a first embodiment of the present invention.

A first embodiment of the present invention will be described with reference to FIG. 1 and FIGS. 4A-4D. An infrared sensor shown in FIG. 1 is used for detecting a gas density or concentration, for example. A certain wavelength range of infrared rays passing through gas is absorbed therein, and the wavelength range absorbed is specific to each gas. A gas density or concentration can be detected based on this phenomenon of the infrared rays.

An infrared sensor 100 shown in FIG. 1 is composed of an optical filter plate 10, an infrared-detecting plate 20, a supporting member 30 and a substrate 60. The optical filter plate 10 is connected to the infrared-detecting plate with a supporting member 30 which also serves to maintain a predetermined gap 32 between both plates 10, 20. The optical filter plate 10 allows infrared rays having a specified wavelength to pass therethrough. The optical filer plate 10 has a front surface 12 from which the infrared rays enter and a rear surface facing the infrared-detecting plate 20. The optical filter plate 10 is made of glass such as silica glass or fluorine glass. Alternatively, it may be made by laminating plural thin films made of ZnS and Ge on a silicon substrate.

The infrared-detecting plate 20 is a semiconductor plate having a front surface 22 on which a detector element 24 is formed. The detector element 24 faces the optical filter plate 10, and the rear surface of the infrared-detecting plate 20 is bonded to the substrate 60. The detector element 24 is composed of a several tens of thermo-electrode pairs connected in series, each pair being made of an n-type silicon thin film and an aluminum thin film, and a film for absorbing infrared rays. The n-type silicon thin film and the aluminum thin film have respectively different Seebeck coefficients. Heat is generated by the infrared rays absorbed in the infrared-absorbing film, and the thermo-electrode pairs generate a voltage from the heat generated in the infrared-absorbing film. The voltage is converted into electrical signals in a circuit formed around the detector element 24 on the infrared-detecting plate 20. The detector element 24 described above is a thermopile-type. However, it may be other types such as a pyroelectric-type, a bolometer-type or a quantum-type.

Figure 4A:
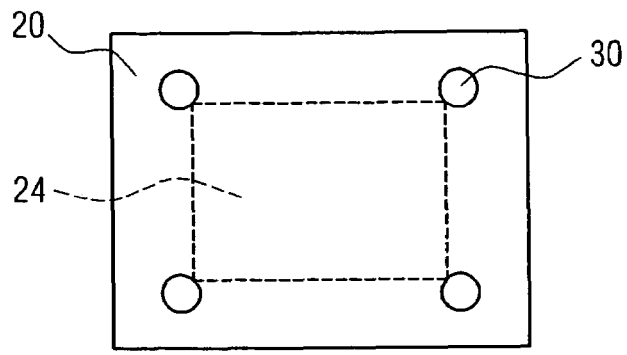
FIGS. 4A-4D show various ways in which a supporting member is placed on an infrared-detecting plate.
Figure 4B:
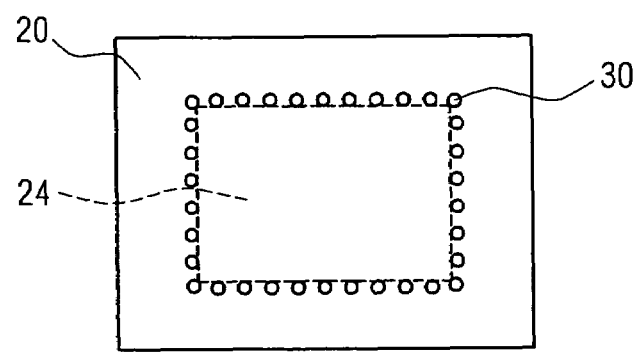
Figure 4C:
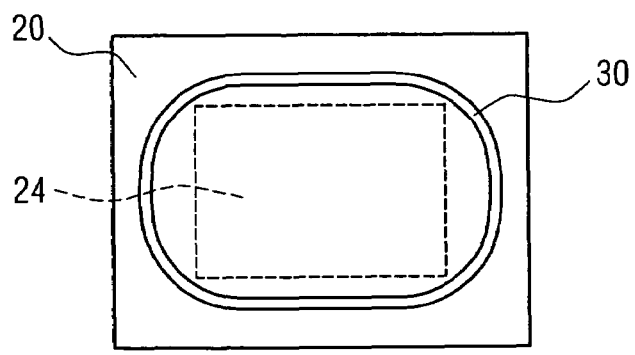
Figure 4D:
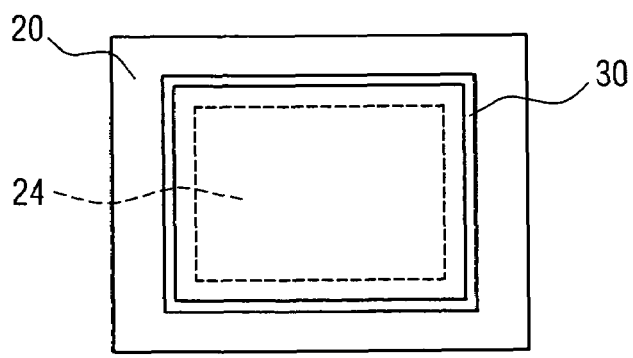

The supporting member 30 disposed between the optical filter plate 10 and the infrared-detecting plate 20 connects both plates 10, 20 and secures the predetermined gap 32 therebetween. The supporting member 30 can be disposed in various manners, as exemplified in FIGS. 4A-4D. In FIG. 4A, the supporting member 30 is composed of four discrete dots positioned at four outside corners of the conductor element 24. In FIG. 4B, the supporting member 30 is composed of a number of discrete small dots positioned along an outer periphery of the detector element 24. In FIG. 4C, the supporting member 30 is placed outside of the detector element 24 in a continuous circular form, and in a continuous square form in FIG. 4D. Though the supporting member 30 surrounds the detector element 24 with a single ring in FIGS. 4C and 4D, it is possible to surround the detector element 24 with more than two rings. By placing the supporting member 30 to continuously surround the detector element 24, infrared rays entering the detector element 24 through the gap 32 are prevented.

The supporting member 30 may be a solder having a low melting point, such as a solder containing lead (Pb) and tin (Sn) as main components. Alternatively, a so-cold lead-free solder alloy made of Sn—Ag, Sn—Bi, Sn—Zn, Sn—Cu or the like may be used as the supporting member 30. It is possible to further add at least one of Ag, Bi, Zn and Cu to the lead-free solder. Further, it is possible to use an adhesive material containing small glass beads in a ball shape or a cylindrical shape.

It is conceivable to directly connect the optical filter plate 10 to the infrared-detecting plate 20 without using the supporting member 30. However, in this case, the optical filer plate 10 may be damaged with scratches in the assembling process, or the detector element 24 may be damaged. To avoid these possibilities, the supporting member 30 for forming and securing the predetermined gap 32 between the optical plate 10 and the infrared-detecting plate 20 is used in the embodiments of the present invention.

Figure 2:
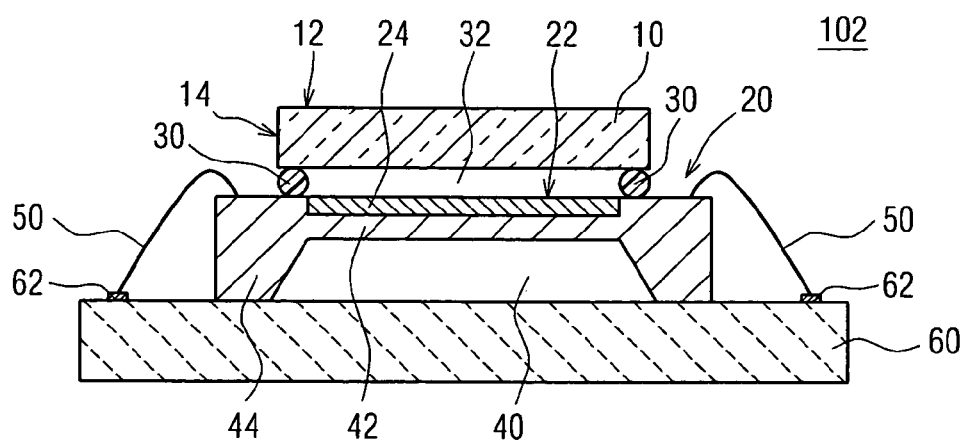
FIG. 2 is a cross-sectional view showing an infrared sensor as a second embodiment of the present invention.

A second embodiment of the present invention will be described with reference to FIG. 2. In an infrared sensor 102 as the second embodiment of the present invention, a depressed portion 40 is formed on the rear surface of the infrared-detecting plate 20. A thin membrane 42 on which the detector element 24 is disposed is formed, and a thick portion 44 surrounding the thin membrane 42 is formed. Other structures of the second embodiment are the same as those of the first embodiment.

The infrared-detecting plate 20 is made of a silicon plate. The depressed portion 40 is formed from the rear surface of the silicon plate using a micromachining technology, for example. The thin membrane 42 is formed on the front surface, and detector element 24 composed of the thermoelectrode pairs and the infrared-absorbing film (the same detector element 24 used in the first embodiment) is formed on the thin membrane 42. An electric voltage is generated in the thermo-electrode pairs from the heat generated by absorbing the infrared rays. The electric voltage is converted into electric signals in the circuit formed around the detector element 24 on the infrared-detecting plate 20. The electric signals are led to the substrate 60 through the bonding wires 50 connected to bonding pads 62, in the same manner as in the first embodiment. Since the detector element 24 is formed on the thin membrane in this embodiment, a heat capacity of the detector element 24 is reduced. Therefore, the detector element 24 quickly responds to the infrared rays incident thereupon.

Figure 3:
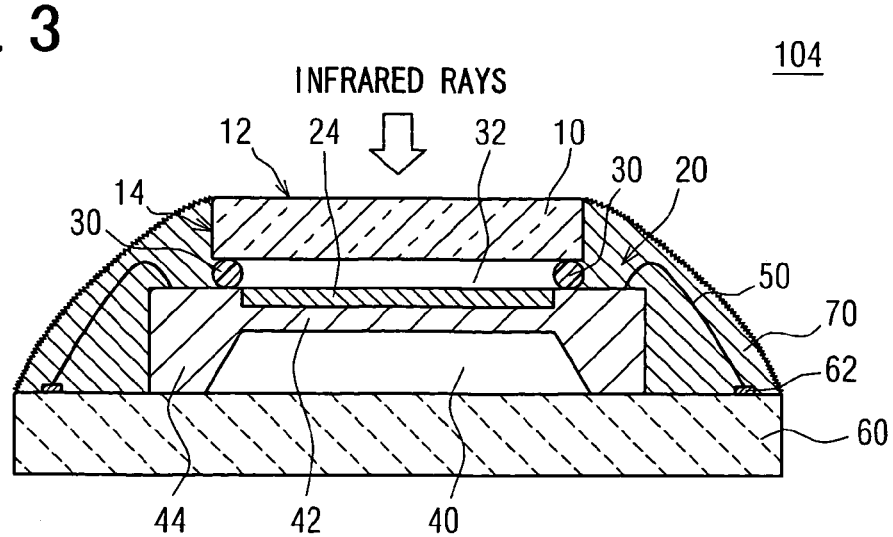
FIG. 3 is a cross-sectional view showing an infrared sensor as a third embodiment of the present invention.

A third embodiment of the present invention will be described with reference to FIG. 3. In an infrared sensor 104 as the third embodiment of the present invention, the infrared sensor 104 is entirely covered with insulating resin 70, except the front surface 12 of the optical filter plate 10 and the substrate 60. In other words, an entire side surface of the infrared sensor 104 including the side surfaces 14 of the infrared-detecting plate 20 and bonding wires 50 is covered with the insulating resin 70. The cover of the insulating resin 70 is formed in a resin-molding process, for example. As the insulating resin 70, various resins, such as epoxy resin, silicone resin, polyimide resin or urethane resin, may be used. Other structures of the third embodiment are the same as those of the second embodiment.

Since the infrared rays entering into the infrared sensor 104 from the side surface are completely cut by the insulating resin 70, directivity of the infrared sensor is improved. In other words, the infrared sensor 104 only responds to the infrared rays entering through the front surface 12. Since the entire side of the infrared sensor 104 including the bonding wires 50 is covered with the insulating resin 70, the strength of the sensor against mechanical impacts is improved. Further, water or dusts are prevented from entering into the sensor 104.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An infrared sensor comprising:
   an optical filter plate that allows selected infrared rays to pass therethrough;
   an infrared-detecting plate having a detector element that detects the infrared rays passing through the optical filter plate; and
   a supporting member, disposed between the optical filter plate and the infrared-detecting plate, for connecting the optical filter plate and the infrared-detecting plate and for forming a predetermined gap between both plates, the supporting member being made of solder and positioned to surround the detector element on the infrared-detecting plate.

2. The infrared sensor as in claim 1, wherein:
   the infrared-detecting plate has a front surface facing the optical filter plate and a rear surface on which a depressed portion is formed, thereby forming a thin membrane on the front surface on which the detector element is disposed.

3. The infrared sensor as in claim 1, further including a substrate on which the infrared-detecting plate is mounted, wherein:
   the infrared sensor is entirely covered with insulating resin, except a front surface of the optical filter plate, from which the infrared rays enter, and the substrate.

4. The infrared sensor as in claim 3, wherein:
   the infrared-detecting plate is electrically connected to the substrate through bonding wires which are covered with the insulating resin.

5. The infrared sensor as in claim 1, wherein:
   the supporting member is composed of a number of discrete dots.

6. The infrared sensor as in claim 1, wherein:
the supporting member is composed of a continuous line surrounding the detector element.

7. The infrared sensor as in claim 1, wherein the solder of the supporting member includes lead and tin.

8. The infrared sensor as in claim 1, wherein the lead-free solder alloy of the supporting member includes one of Sn—Ag, Sn—Bi, Sn—Zn and Sn—Cu.

9. An infrared sensor comprising:
an optical filter plate that allows selected infrared rays to pass therethrough;
an infrared-detecting plate having a detector element that detects the infrared rays passing through the optical filter plate; and
a supporting member disposed between the optical filter plate and the infrared-detecting plate for connecting the optical filter plate and the infrared-detecting plate and forming a predetermined gap between the optical filter plate and the infrared-detecting plate, wherein the supporting member is made of solder to electrically connect the optical filter plate to the infrared-detecting plate, wherein the supporting member is positioned to surround the detector element on the infrared-detecting plate.

10. An infrared sensor comprising:
an optical filter plate that allows selected infrared rays to pass therethrough;
an infrared-detecting plate having a detector element that detects the infrared rays passing through the optical filter plate; and
a supporting member disposed between the optical filter plate and the infrared-detecting plate for connecting the optical filter plate and the infrared-detecting plate and forming a predetermined gap between the optical filter plate and the infrared-detecting plate, wherein the supporting member is made of a lead-free solder alloy to electrically connect the optical filter plate to the infrared-detecting plate, wherein the supporting member is positioned to surround the detector element on the infrared-detecting plate.

* * * * *